United States Patent
Pixley et al.

(10) Patent No.: US 11,222,768 B2
(45) Date of Patent: *Jan. 11, 2022

(54) FOAM IN ION IMPLANTATION SYSTEM

(71) Applicant: Varian Semiconductor Equipment Associates, Inc., Gloucester, MA (US)

(72) Inventors: James Alan Pixley, Dover, NH (US); Eric D. Hermanson, Georgetown, MA (US); Philip Layne, Salem, MA (US); Lyudmila Stone, Lynnfield, MA (US); Thomas Stacy, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/551,042

(22) Filed: Aug. 26, 2019

(65) Prior Publication Data

US 2020/0083021 A1      Mar. 12, 2020

Related U.S. Application Data

(63) Continuation-in-part of application No. 16/161,989, filed on Oct. 16, 2018, now Pat. No. 10,643,823.

(60) Provisional application No. 62/728,429, filed on Sep. 7, 2018.

(51) Int. Cl.
*H01J 37/317* (2006.01)
*H01L 21/768* (2006.01)
*H01L 21/02* (2006.01)
*H01J 37/32* (2006.01)

(52) U.S. Cl.
CPC ...... *H01J 37/3171* (2013.01); *H01L 21/0203* (2013.01); *H01L 21/76859* (2013.01); *H01J 37/32412* (2013.01)

(58) Field of Classification Search
CPC .............. H01J 37/3171; H01J 37/3172; H01J 2237/0213; H01J 2237/022; H01J 2237/026; H01J 2237/068; H01J 2237/028

See application file for complete search history.

(56) References Cited

U.S. PATENT DOCUMENTS

| 5,670,217 | A | * | 9/1997 | Blake ................. H01J 37/3002 427/476 |
|---|---|---|---|---|
| 6,358,376 | B1 | | 3/2002 | Wang et al. |
| 6,929,725 | B2 | | 8/2005 | Friedrich et al. |
| 8,471,476 | B2 | | 6/2013 | Kurunczi et al. |
| 2007/0158188 | A1 | | 7/2007 | Ivanov |
| 2011/0012033 | A1 | | 1/2011 | Colvin |
| 2012/0085917 | A1 | | 4/2012 | Kurunczi et al. |

FOREIGN PATENT DOCUMENTS

KR       10-1755970 B1     7/2017

OTHER PUBLICATIONS

International Search Report and Written Opinion dated Dec. 16, 2019 for PCT/US19/48332 filed Aug. 27, 2019.

* cited by examiner

*Primary Examiner* — Eliza W Osenbaugh-Stewart
(74) *Attorney, Agent, or Firm* — Kacvinsky Daisak Bluni PLLC

(57) ABSTRACT

Disclosed is a semiconductor processing apparatus including one or more components having a conductive or non-conductive porous material. In some embodiments, an ion implanter may include a plurality of beam line components for directing an ion beam to a target, and a porous material along a surface of at least one of the plurality of beamline components.

20 Claims, 3 Drawing Sheets

US 11,222,768 B2

FOAM IN ION IMPLANTATION SYSTEM

This application is a continuation-in-part of U.S. Non-Provisional patent application Ser. No. 16/161,989 filed Oct. 16, 2018, which claims priority to U.S. Provisional Patent Application No. 62/728,429 filed Sep. 7, 2018, the entire contents of the applications incorporated by reference herein.

FIELD OF THE DISCLOSURE

Embodiments of the present disclosure relate to ion implantation of semiconductor structures. More particularly, embodiments of the present disclosure relate to using conductive or nonconductive foam in an ion implantation system.

BACKGROUND OF THE DISCLOSURE

Ion implantation is a process used to dope impurity ions into a substrate such as, for example, a semiconductor wafer. Generally, an ion beam is directed from an ion source chamber toward a substrate. Different feed gases are supplied to the ion source chamber to obtain plasma used to form ion beams having particular dopant characteristics. For example, from the feed gasses $PH_3$, $BF_3$, or $AsH_3$, various atomic and molecular ions are created within the ion source, and subsequently accelerated and mass selected. The depth of implantation of the generated ions into the substrate is based on the ion implant energy and the mass of the ions. One or more types of ion species may be implanted in the target wafer or substrate in different doses and at different energy levels to obtain desired device characteristics. A precise doping profile in the substrate is essential to proper device operation.

While implanting certain species during the implantation process, sputter from the wafer is reflected back towards the various components of the ion implantation system. Furthermore, contaminant deposition can come directly from the ion beam. As a result, the components become heavily coated with contaminants/particles, leading to flaking. The flaking often results in elevated particle counts affecting device performance yield.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an ion implanter may include a plurality of beam line components for directing an ion beam to a target, and a porous material along a surface of at least one of the plurality of beamline components.

In another embodiment, an apparatus may include a plurality of beam line components disposed along for directing an ion beam to a wafer, and a porous material along a surface of at least one of the plurality of beamline components.

In yet another embodiment, an ion implanter may include a plurality of beam line components for directing an ion beam to a wafer within a processing chamber, and a porous material along a surface of the processing chamber.

Figure 1:
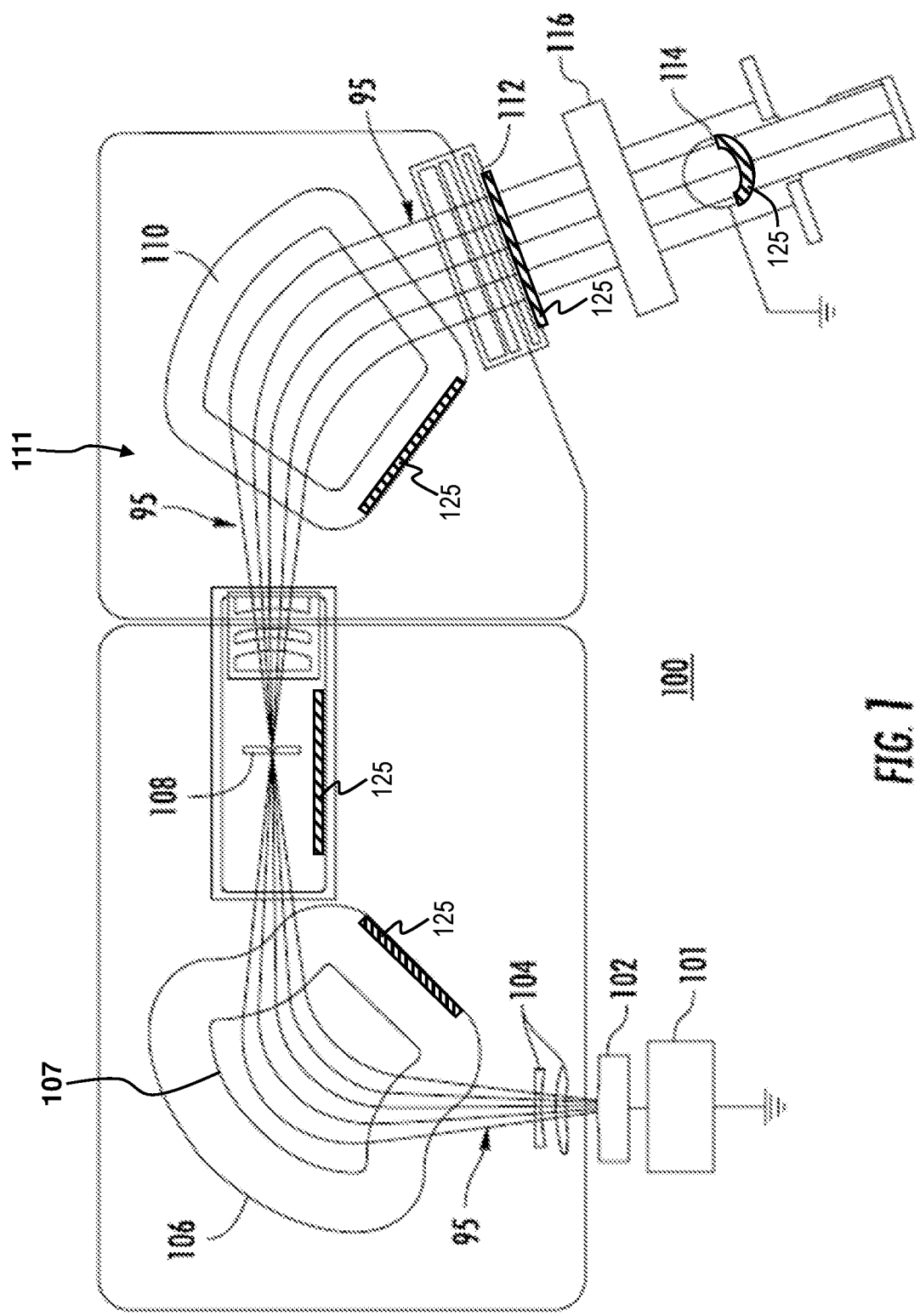
FIG. 1 depicts an ion implanter system incorporating a plasma flood gun assembly in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Apparatuses and ion implanters in accordance with the present disclosure will now be described more fully hereinafter with reference to the accompanying drawings, where embodiments of the methods are shown. The apparatus and devices may be embodied in many different forms and are not to be construed as being limited to the embodiments set forth herein. Instead, these embodiments are provided so this disclosure will be thorough and complete, and will fully convey the scope of the system and method to those skilled in the art.

Ion implanters are widely used in semiconductor manufacturing to selectively alter conductivity of materials. In some ion implanters, ions generated from an ion source are directed through a series of beam-line components, for example, including one or more analyzing magnets and a plurality of electrodes. The beam-line components select desired ion species, filter out contaminant species and ions having undesirable energies, and adjust ion beam quality at a target wafer. Suitably shaped electrodes may modify the energy and the shape of an ion beam.

As will be described in greater detail herein, conductive or nonconductive porous material, or "foam", can be used to cover any and all surfaces that accumulate deposition within the ion implanter. In various applications, the foam may be an aluminum foam, a silicon carbide (SiC) foam, an alumina foam, a graphite foam, and/or other conductive or nonconductive materials compatible with the chemistries and processes involved. Deposition may come directly from the ion beam, or it may come from material sputtered/spalled (or otherwise liberated) by the ion beam. For example, all surfaces in the wafer process chamber are generally exposed to material deposition that is sputtered from the wafer. These surfaces include the walls of the chamber, the surfaces of the wafer holding and scanning apparatus, the liners in the chamber, the surfaces of a plasma flood gun, and one or more shields. The foam can be applied to these surfaces for capturing the direct or sputtered material.

Deposition may also occur on surfaces in the line of sight of the beam strike areas. For example, non-selected beams may impact graphite beam dumps in an analyzer magnet.

These graphite parts may be eroded by the beam and the resulting deposition accumulates on, for example, the chamber surfaces and liners in the analyzer magnet and the neighboring chambers. Furthermore, in addition to chamber and chamber liner surfaces, the foam may be applied to one or more apparatuses that collect deposition, such as faradays, a mass slit device, magnets, and electrostatic lenses.

An exemplary ion implanter system 100 is generally shown in FIG. 1 and includes an ion source chamber 102, and a series of beam line components 111 for directing an ion beam 95 to a wafer or substrate. These components 111 are housed in a vacuum environment and configured to provide ion dose levels with high or low energy implantation based on the desired implant profile. In particular, the implanter system 100 includes an ion source chamber (hereinafter "chamber") 102 to generate ions of a desired species. The chamber 102 may have an associated hot cathode powered by power supply 101 to ionize feed gas introduced into the chamber 102 to form charged ions and electrons (plasma). The hot cathode may be, for example, a heated filament or an indirectly heated cathode.

Different feed gases are supplied to the chamber 102 to generate ions having particular dopant characteristics. The ions may be extracted from source chamber 102 via an extraction electrode configuration 104 used to create a desired electric field to focus the ion beam 95 extracted from the chamber 102. The ion beam 95 passes through a mass analyzer chamber 106 having a magnet functioning to pass just ions having the desired charge-to-mass ratio to a resolving aperture. In particular, an analyzer magnet 107 can include a curved path where the ion beam 95 is exposed to the applied magnetic field, causing ions having the undesired charge-to-mass ratio to be deflected away from the beam path. A collimator magnet 110 is positioned downstream of a mass slit device 108 and is configured to deflect the ion beam 95 into a ribbon beam having parallel trajectories. A magnetic field may be used to adjust the deflection of the ions via a magnetic coil.

The ion beam 95 is targeted toward a work piece attached to a support or platen 114. An acceleration/deceleration stage 112 is utilized and may be disposed between the collimator magnet 110 and the support 114. The acceleration/deceleration stage 112 (also referred to as an electrostatic filter or lens) may be positioned close to a target substrate on the platen 114 and may include a plurality of electrodes (e.g. three) to implant the ions into the target substrate at a desired energy level. Because the ions lose energy when colliding with electrons and nuclei in the substrate, the ion come to rest at a desired depth within the substrate based on the acceleration energy. The ion beam 95 may be distributed over the target substrate by beam scanning, by substrate movement using platen 114, or by a combination of beam scanning and substrate movement. A plasma flood gun (PFG) assembly 116 can be positioned immediately upstream of the platen 114 to apply plasma to the ion beam just before the beam impacts the substrate. As shown, a foam 125 may be formed or deposited along one or more surfaces of any of the beam line components 111, including along a surface of the PFG assembly 116, the analyzer magnet 107, the collimator magnet 110, the mass slit device 108, or the acceleration/deceleration stage 112. Furthermore, the foam 125 may be disposed along any surface of the chamber(s) housing each of the beam line components 111.

Figure 2:
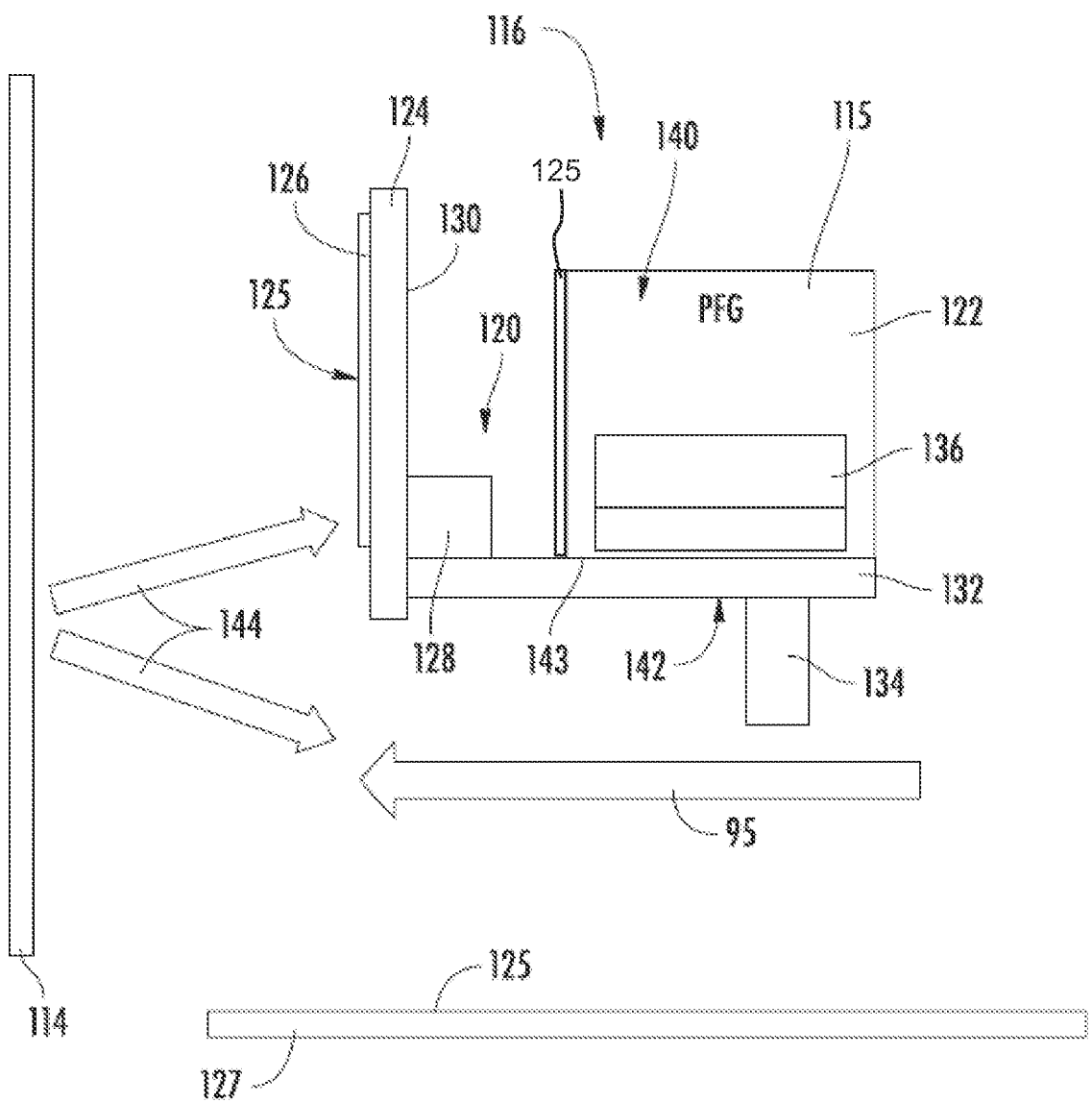
FIG. 2 is an end view of the plasma flood gun assembly of FIG. 1 in accordance with embodiments of the present disclosure.

Referring to FIG. 2, the assembly 116 according to embodiments of the present disclosure will be described in greater detail. During use, the ion beam 95 is delivered to an ion beam target, such as a support or platen 114. The ion beam 95 may travel beneath the PFG 115, the PFG 115 including a main body 140, and is operable to supply a plasma to the ion beam 95. As shown, a second shield 134 of the shield assembly 120 may extend down from a mounting plate 132 to protect exit apertures 142 of a PFG 115. In some embodiments, the second shield 134 and the mounting plate 132 are oriented perpendicular to one another. A connection block 128 may couple together a first shield 124 and the mounting plate 132, for example, along a second main side 130 of the first shield 124. The mounting plate 132 may be coupled to the housing 122 of the PFG 115 by a bracket 136, wherein the bracket 136 may be L-shaped. In some embodiments, the mounting plate 132 partially surrounds a footprint or perimeter 143 of a main body 140 of the PFG 115.

The PFG 115 is often located near the ion beam 95, just before the ion beam 95 reaches a target substrate disposed on platen 114. In the housing 122 of the PFG 115, the exit apertures 142 are positioned to allow the generated plasma to flow into contact with the ion beam 95. As the ion beam 95 impacts the platen 114, sputter 144 is generated, and redirected back towards the PFG 115. The sputter 144 may be received by a first main side 126 of the first shield 124. In some embodiments, the first shield 124 includes one or more foam-like structures. Alternatively, the first shield 124 may include an exterior layer of foam 125 or may be made be made entirely from a foam material. Providing the first shield 124 as a foam-like component differs from conventional solid structures used to line semiconductor equipment machines.

Although non-limiting, the first shield 124 may be conductive or non-conductive. For example, the first shield may be an aluminum foam, a silicon carbide (SiC) foam, an alumina foam, a graphite foam, and/or other conductive or nonconductive materials compatible with the chemistries and processes involved. In some cases, using a SiC foam may be more suitable in similar applications where aluminum may be insufficient. For example, aluminum foam is a cost-effective solution for lining regions insensitive to metals, while SiC coated foam can be used in places where aluminum foam results in excessive metals counts on the customer's wafer. The foams are capable of extending time between machine maintenance by capturing re-deposition coatings (e.g., sputter 144) resulting from the implant process. The sputter 144 is trapped within the layer of the foam 125 as opposed to sitting on the surface of the first shield 124 and other components of the assembly 116 where the sputter 144 is much more likely to flake off.

In some embodiments, various other components of the system 100 may be made from or coated with a conductive or nonconductive foam. For example, the layer of foam 125 may also be provided on one or more process chamber walls 127 defining a process chamber 129. The foam 125 acts as a liner for trapping the redeposited material, such as the sputter 144, significantly longer than liner materials and textures used in prior art approaches.

Figure 3:
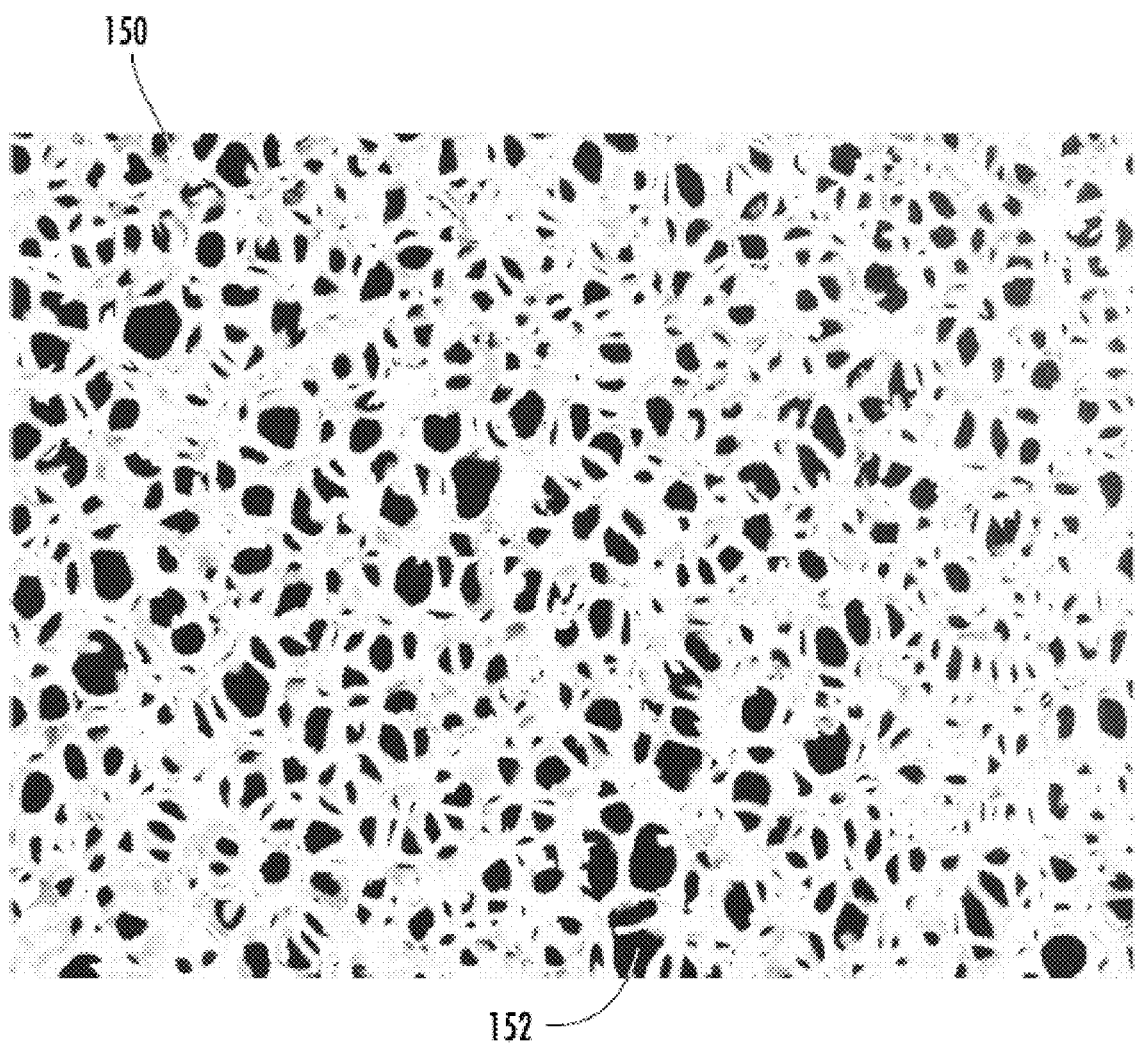
FIG. 3 is an example of a metal foam for use in the ion implanter system of FIG. 1 in accordance with embodiments of the present disclosure.

FIG. 3 demonstrates a non-limiting Al foam 150. The Al foam 150 may be the same or similar to the layer of foam 125 disposed along the first shield 124 and/or the process chamber walls 127 shown in FIG. 2. In some embodiments, the Al foam 150 is a metal foam manufactured from aluminum and defining a plurality of pores 152. As used herein, the Al foam 150 is a foamed aluminum made from aluminum or an aluminum alloy having a large volume fraction of pores 152 or cells. The plurality of pores 152 may be disposed in fluid communication with each other to form an interconnected network and define an open-cell foam. The foamed aluminum may include a very high porosity.

Each of the plurality of pores 152 includes a pore size. The shape of each of the plurality of pores 152 may be uniform, yet not limited to a spherical shape, or may vary between the different pores 152. As used herein, the pore size may be defined as the maximum distance across the void defined by each pore. For example, if the pore defines a spherical shape, then the pore size may be defined as the diameter of the sphere. Although, because the pores 152 may include a non-standard geometric shape, e.g., a non-spherical shape, one will appreciate the pores 152 may not define a diameter as generally understood. Accordingly, the pore size is defined herein as the maximum distance across the void defined by the specific pore. Preferably, the pore size of any of the plurality of pores 152 is between 0.1 mm and 4.0 mm. Although, one will appreciate the pore size may differ.

As noted above, the Al foam 150 includes a porosity, i.e., a pore density. As used herein, the pore density is the number of pores 152 per unit volume of the Al foam 150. The pore density may be uniform across a cross section of the Al foam 150. Alternatively, the pore density may vary across a cross section of the Al foam 150 to define a plurality of cross-sectional regions within the cross section of the Al foam 150. Accordingly, each cross-sectional region of the Al foam 150 may include a different pore density than any adjacent cross-sectional region.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. Various features of the certain aspects, embodiments, or configurations of the disclosure may be combined in alternate aspects, embodiments, or configurations. Moreover, the following claims are hereby incorporated into the Detailed Description by reference, with each claim standing alone as a separate embodiment of the present disclosure.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

As described herein, one will appreciate the disclosure provides at least the following technical benefits/advantages. Firstly, the foams are capable of extending time between machine maintenance by capturing deposition coming directly from the ion beam and/or re-deposition coatings (e.g., sputter) resulting from the implant process. The sputter is trapped within the layer(s) of the foam as opposed to sitting on the surfaces of the ion implanter. Secondly, use of the foam and shields increases time between preventative maintenance, thus improving cost of ownership. Unlike the prior art, wherein the material coating sensitive areas of the machine accumulates at a rate requiring excessive downtime to clean, the foam of the present disclosure allows greater accumulation of the sputtered material.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. An ion implanter, comprising:
   a plurality of beam line components for directing an ion beam to a target, the plurality of beam line components including a plasma flood gun;
   a shield assembly directly coupled to the plasma flood gun, the shield assembly comprising a first shield having a first main side facing the target; and
   a porous material along the first main side of the first shield.

2. The ion implanter of claim 1, wherein the target is a wafer located within a process chamber.

3. The ion implanter of claim 2, wherein the porous material is further disposed along a process chamber wall of the process chamber.

4. The ion implanter of claim 2, wherein the wafer is supported by a platen, and wherein the porous material is further disposed along a surface of the platen.

5. The ion implanter of claim 1, the porous material comprising an aluminum foam, a silicon carbide foam, an aluminum oxide foam, or a graphite foam.

6. The ion implanter of claim 1, wherein the porous material has a uniform pore density.

7. The ion implanter of claim 1, wherein the porous material has a non-uniform pore density.

8. The ion implanter of claim 1, wherein the first main side of the first shield defines a plane oriented perpendicular to a beam line defined by a direction of travel of the ion beam.

9. An apparatus, comprising:
- a plurality of beam line components for directing an ion beam to a wafer, the plurality of beam line components including a plasma flood gun;
- a shield assembly directly coupled to the plasma flood gun, the shield assembly comprising a first shield having a first main side facing the wafer; and
- a porous material along the first main side of the first shield.

10. The apparatus of claim 9, wherein the wafer is located within a process chamber.

11. The apparatus of claim 10, wherein the porous material is further disposed along a process chamber wall of the process chamber.

12. The apparatus of claim 10, wherein the wafer is supported by a platen, and wherein the porous material is further disposed along a surface of the platen.

13. The apparatus of claim 9, the porous material comprising an aluminum foam, a silicon carbide foam, an aluminum oxide foam, or a graphite foam.

14. The apparatus of claim 9, wherein the porous material has a uniform pore density or a non-uniform pore density.

15. The apparatus of claim 9, wherein the porous material is further disposed along a surface of the plasma flood gun.

16. The apparatus of claim 15, wherein the first main side of the shield assembly defines a plane oriented perpendicular to a beam line defined by a direction of travel of the ion beam.

17. An ion implanter, comprising:
- a plurality of beam line components for directing an ion beam to a wafer within a processing chamber, the plurality of beam line components including a plasma flood gun;
- a shield assembly directly coupled to the plasma flood gun, the shield assembly comprising a first shield having a first main side facing the wafer; and
- a porous material along the first main side of the first shield.

18. The ion implanter of claim 17, wherein the wafer is supported by a platen, and wherein the porous material is further disposed along a surface of the platen.

19. The ion implanter of claim 17, the porous material comprising an aluminum foam, a silicon carbide foam, an aluminum oxide foam, or a graphite foam.

20. The ion implanter of claim 17, wherein the porous material is further disposed along a surface of the plasma flood gun.

* * * * *